United States Patent [19]

Auvray et al.

[11] Patent Number: 5,732,339
[45] Date of Patent: Mar. 24, 1998

[54] FREQUENCY OFFSET CORRECTION

[75] Inventors: Gérard Auvray, Bezons; Olivier Perron, Franconville, both of France

[73] Assignee: Alcatel Mobile Commuication France, Paris, France

[21] Appl. No.: 545,955

[22] Filed: Oct. 20, 1995

[30] Foreign Application Priority Data

Oct. 25, 1994 [FR] France .................. 94 12738

[51] Int. Cl.$^6$ .................................. H04B 1/18
[52] U.S. Cl. .............. 455/192.2; 375/344; 331/12; 455/265
[58] Field of Search ................... 455/255, 257, 455/258, 265, 313, 318, 196.1, 197.1, 192.2; 331/12; 375/344

[56] References Cited

U.S. PATENT DOCUMENTS

| | | |
|---|---|---|
| 4,647,864 | 3/1987 | Rafferty et al. . |
| 4,879,728 | 11/1989 | Tarallo ............... 375/80 |
| 5,062,123 | 10/1991 | Geile et al. ......... 375/81 |
| 5,152,005 | 9/1992 | Bickley ............... 455/76 |
| 5,282,227 | 1/1994 | Crawford ............ 375/81 |
| 5,434,889 | 7/1995 | Baier ................... 375/344 |
| 5,438,591 | 8/1995 | Oie et al. ........... 375/261 |

FOREIGN PATENT DOCUMENTS

0500025A2  8/1992  European Pat. Off. .

Primary Examiner—Andrew Faile
Assistant Examiner—Vincent F. Boccio
Attorney, Agent, or Firm—Sughrue, Mion, Zinn, Macpeak & Seas, PLLC

[57] ABSTRACT

In a method and a device for correcting a frequency offset between a receive signal and a reference signal, the receive signal, being fed to a frequency converter which also receives a conversion signal in order to produce a transposed signal, the conversion signal is produced by a local oscillator in response to a control signal. The device initializes the control signal according to the reference signal. An estimator receives the transposed signal and the control signal and produces repetitively an estimate of the frequency offset comprising the sum of a correction value and an adjustment value respectively greater than and less than a predetermined correction threshold. The control signal is modified in response to the correction value. The transposed signal is connected using at least one of the successive estimates.

17 Claims, 3 Drawing Sheets

FREQUENCY OFFSET CORRECTION

BACKGROUND OF THE INVENTION

1. Field of the Invention

The field of the invention is that of correcting a frequency offset between a receive signal and a reference signal.

2. Description of the Prior Art

In a transmission system, a transmitter transmits a transmit signal over a transmission channel causing a receive signal to be received by a receiver. The receiver is tuned to a reference frequency that corresponds to the frequency of the transmit signal. The frequency of the receive signal may be offset relative to the reference frequency, however. This offset degrades the information conveyed by the received signal during processing of the latter signal in the receiver. It must therefore be corrected.

To clarify the problems caused by the need for such correction, a radiocommunication system will be considered by way of illustrative example. In a system of this kind the receive signal is a radiofrequency signal. This signal can have a frequency offset relative to the reference signal generated locally in the receiver because the clocks of the transmitter and the receiver are not synchronized. What is more, if the receiver is moving at a relatively high speed, the Doppler effect will also contribute to this frequency offset. The Doppler effect will obviously be more marked in systems using satellites. In satellites in low Earth orbit, for example, the frequency offset due to this phenomenon can vary from +45 kHz to −45 kHz in the case of a 2.5 GHz receive signal.

The receiver usually includes a frequency converter which produces a transposed signal from the receive signal and a conversion signal. The transposed signal is an intermediate frequency signal or a baseband signal.

The conversion signal is produced by a local oscillator, which is a frequency synthesizer, for example, in response to a control signal.

A first solution to the problem of correcting the frequency offset is to use a phase-locked loop.

In this technique, which is known in itself, the control signal of the local oscillator is operated on directly. It follows that the local oscillator must be able to produce a conversion signal with a frequency whose accuracy is at least equal to that expected of the correction.

This technique is relatively costly to implement.

It is also ill suited to time-division multiple access systems in which the receive signal is in the form of a succession of packets or bursts transmitted periodically in time slots of constant duration. The lock-up time of the loop may not be negligible compared to the time slot duration.

A second solution developed to eliminate the constraints of the first solution makes the frequency of the conversion signal equal to that of the reference signal which is the theoretical value of that of the receive signal.

The transposed signal is usually subjected to analog-to-digital conversion after the frequency conversion and this means that the frequency offset can be corrected by processing in the digital domain if the value of the offset is known. If the offset is large, the transposed signal has a frequency substantially different from that it would have in the absence of any offset. This is undesirable, especially if channel filtering is effected after frequency conversion. The filter is tuned to a center frequency that corresponds to a nil frequency offset. If the transposed signal departs from this center frequency, it can reach the limits of the bandwidth of the filter.

In any event, the performance of the filter will be degraded, especially its frequency linearity and its error rate.

An object of the present invention is to propose a device for correcting a frequency offset between a receive signal and a reference signal that is optimized from the performance and cost points of view.

SUMMARY OF THE INVENTION

To this end, the device for correcting a frequency offset between a receive signal and a reference signal applies when said receive signal is fed to a frequency converter which also receives a conversion signal in order to produce a transposed signal, said conversion signal being produced by a local oscillator in response to a control signal, and the device comprises:

means for initializing the control signal according to the reference signal, estimator means which receive the transposed signal and the control signal to produce repetitively an estimate of said frequency offset, said estimate comprising the sum of a correction value and an adjustment value respectively greater than and less than a predetermined correction threshold, means for modifying the control signal in response to said correction value, and means for correcting the transposed signal by means of at least one of said successive estimates.

The optimization of the device is the result of sharing correction between the local oscillator and the signal processor.

The conversion signal possibly comprising discrete frequencies regularly spaced by an incremental value, the correction threshold is chosen equal to said incremental value.

Said correction value is a multiple of the incremental value.

Thus the signal processor assumes responsibility for only that part of the correction that cannot be effected by the local oscillator.

The device effects a first estimate by means of a first set of parameters dependent on the maximum offset between the reference signal and the receive signal and then effects a subsequent estimate by means of a second set of parameters dependent on the correction threshold.

This exploits the fact that the smaller the frequency offset the easier it is to estimate the offset.

Different sequences of the receive signal are used for the first estimate and for the subsequent estimate.

If the offset has already been partly corrected, the signalling used to correct the offset can be simplified.

The receive signal being in the form of a succession of bursts each comprising a training sequence and a data sequence, one of the estimates is effected on the training sequence to correct the data sequence.

This takes maximum advantage of the structure of the receive signal.

In accordance with a further feature of the device, the estimates are obtained by means of the autocorrelation function of a known sequence of the transmit signal corresponding to the receive signal.

The invention also consists in a method of correcting a frequency offset between a receive signal and a conversion signal comprising the following steps:

conversion of the receive signal by means of a conversion signal to produce a transposed signal;

a first estimate of the frequency offset;

modification of the conversion signal in response to said first estimate;

a new estimate of the residual frequency offset between the receive signal and the modified conversion signal; and correction of the transposed signal by means of said residual offset.

The invention will emerge in more detail from embodiments described by way of illustrative example with reference to the appended drawings.

DETAILED DESCRIPTION OF THE INVENTION

The same items appearing in more than one figure are always identified by the same reference number.

A typical application of the invention is explained with reference to a radio communication system, as already explained.

To maintain the generality of this application, the signals considered are complex signals, i.e. the modulation is effected on two channels in phase quadrature, usually called the I channel and the Q channel.

Figure 1:
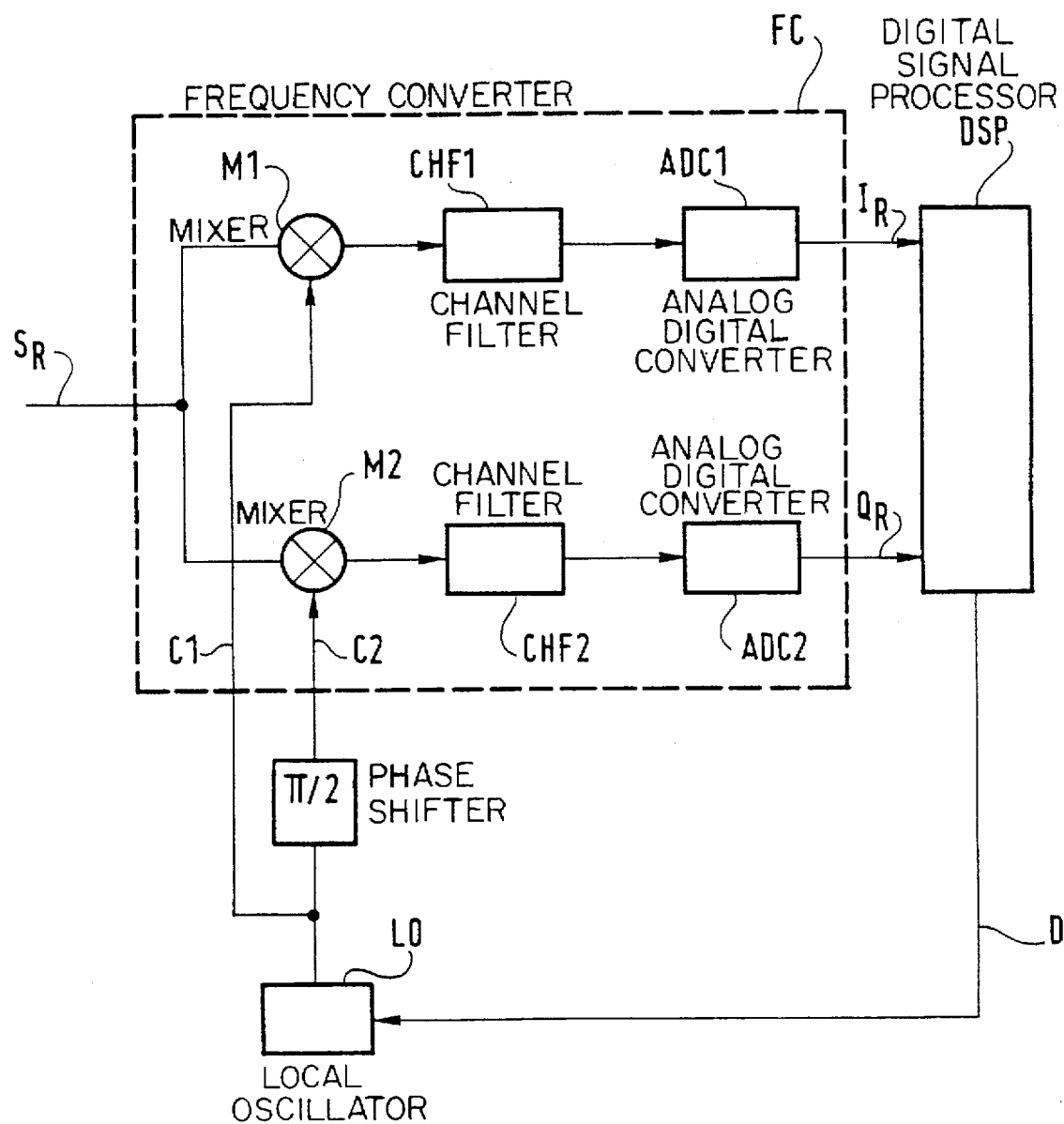
FIG. 1 shows one arrangement of the correction device of the invention in a receiver.

Referring to FIG. 1, the receiver includes a frequency converter FC for processing each channel. The term "converter" as used here is to be understood in the widest sense, although it can merely comprise a mixer.

For the I channel the converter FC includes a first mixer M1 which receives the receive signal $S_R$ and a first conversion signal $C_1$. It also includes a first channel filter CHF1 connected to the output of the first mixer M1 and followed by a first analog-digital converter ADC1 delivering samples $I_R$ at a sampling frequency $f_s$.

For the Q channel, the frequency converter FC includes a second mixer M2 which receives the receive signal $S_R$ and a second conversion signal $C_2$. It also includes a second channel filter CHF2 connected to the output of the second mixer M2 and followed by a second analog-digital converter ADC2 delivering samples $Q_R$ at the sampling frequency $f_s$.

The combination of the samples $I_R$ and $Q_R$ constitutes the transposed signal.

Digital technology has been chosen for this embodiment as it is now routinely used and its advantages no longer need to be explained. Accordingly, the frequency offset correction device is implemented by means of a digital signal processor DSP which can be used for other purposes.

The processor DSP receives the samples $I_R$ and $Q_R$. It also supplies a control signal D the nature of which is explained later.

The receiver further includes a local oscillator LO such as a frequency synthesizer which produces the first conversion signal C1 in response to the control signal D.

The first conversion signal C1 is also fed to a $\pi/2$ phase-shifter producing the second conversion signal C2.

The function of the correction device DSP is to correct the frequency offset between the receive signal $S_R$ and a reference signal the value of which is stored in an internal or external memory (not shown).

Before it can be corrected, the offset must be estimated. A method can be used for this derived from that employed in the radar field, as described in "SUPELEC" document No 3113 of 1986: "Théorie de la détection et de l'estimation, Application au Radar" ("Theory of detection and estimation, Application to Radar"), Jean-Marie COLIN.

Using this method, if $S_E(t)$ denotes the transmit signal produced by the transmitter, $S_R(t)$ denotes the receive signal, $f_d$ denotes the frequency offset and $\hat{f}_d$ denotes an estimate of the offset, then the best estimate maximizes the integral Int:

$$\text{Int} = \int S^*_E(t) S_R(t) e^{-j2\pi \hat{f}_d t} dt$$

By a standard convention, $S^*_E(t)$ represents the conjugate value of $S_E(t)$.

The transmit signal $S_E(t)$ is naturally known to the receiver, where it is stored.

The above integral Int is readily transposed to a sum Sig if the time variable is changed from continuous to discrete, as is the case with digital signals. In this case, assuming that the duration $T_S$ of the symbols of the transmit signal is equal to the reciprocal of the sampling frequency $f_s$, one of these symbols $S_E(kT_S)$ is the sum of a real part $I_E(kT_S)$ and an imaginary part $Q_E(kT_S)$:

$$S_E(kT_S) = I_E(kT_S) + jQ_E(kT_S)$$

Assuming further that the transposed signal is a baseband signal, then a corresponding sample $S_R(kT_S)$ of this signal is similarly written:

$$S_R(kT_S) = I_R(kT_S) + jQ_R(kT_S)$$

Considering N consecutive symbols, the sum Sig can be written:

$$\text{Sig}(\hat{f}_d) = \sum_{k=0}^{N-1} S_E^*(kT_S) S_R(kT_S) e^{-j2\pi \hat{f}_d kT_S}$$

$$\text{Sig}(\hat{f}_d) = \sum_{k=0}^{N-1} [I_E(kT_S)I_R(kT_S) + Q_E(kT_S)Q_R(kT_S)]\cos(2\pi\hat{f}_d kT_S) +$$

$$[I_E(kT_S)Q_R(kT_S) - Q_E(kT_S)I_R(kT_S)]\sin(2\pi\hat{f}_d kT_S) -$$

$$j[I_E(kT_S)I_R(kT_S) + Q_E(kT_S)Q_R(kT_S)]\sin(2\pi\hat{f}_d kT_S) +$$

$$j[I_E(kT_S)Q_R(kT_S) - Q_E(kT_S)I_R(kT_S)]\cos(2\pi\hat{f}_d kT_S)$$

If $\hat{f}_d$ is the best estimate of $f_d$ and if the receive signal is not affected by the transmission, then:

$$S_E(kT_S) = S_R(kT_S) e^{-j2\pi \hat{f}_d kT_S}$$

It follows that Sig is the autocorrelation function of the transmit signal and corresponds to the energy of that signal.

The sum $\text{Sig}(\hat{f}_d = f_d)$ is therefore a real and maximal value.

In practise, $\hat{f}_d$ must take discrete values and an advantageous solution is to choose $\hat{f}_d$ as a multiple of a unit offset $\Delta f$:

$$\hat{f}_d = p\Delta f$$

If the frequency offset $f_d$ is in the range $f_1$, $f_2$, then p will vary from $p_1$ to $p_2$ so that:

$$p_1 \Delta f \leq f_1 < (p_1 + 1)\Delta f$$

$$(p_2 - 1)\Delta f < f_2 \leq p_2 \Delta f$$

The structure of the correction device will not be described since the device implements basic operations well known to the person skilled in the art such as addition, multiplication and comparison. As it is implemented in a digital signal processor, a functional description of the implementation of the invention would definitely seem preferable in any event.

Thus, substituting $p.\Delta f$ for $\hat{f}_d$:

$$Sig(\hat{f}_d)=Sig(p\Delta f)$$

The above sum has a real part $A_p$ and an imaginary part $B_p$:

$$Sig(p\Delta f)=A_p+jB_p$$

where:

$$A_p = \sum_{k=0}^{N-1} [I_E(kT_S)I_R(kT_S) + Q_E(kT_S)Q_R(kT_S)]\cos(2\pi\hat{f}_d kT_S) +$$

$$[I_E(kT_S)Q_R(kT_S) - Q_E(kT_S)I_R(kT_S)]\sin(2\pi\hat{f}_d kT_S)$$

$$B_p = \sum_{k=0}^{N-1} -[I_E(kT_S)I_R(kT_S) + Q_E(kT_S)Q_R(kT_S)]\sin(2\pi\hat{f}_d kT_S) +$$

$$[I_E(kT_S)Q_R(kT_S) - Q_E(kT_S)I_R(kT_S)]\cos(2\pi\hat{f}_d kT_S)$$

As previously stated, the imaginary part B of Sig that coincides with a change of sign must be eliminated. Consider, therefore, two successive pairs $(A_p, B_p)$, $(A_{p+1}, B_{p+1})$ respectively referred to hereinafter as the last pair calculated identified by the suffix 1 ($A_l=A_p$, $B_l=B_p$) and the new pair identified by the suffix n ($A_n=A_{p+1}$, $B_n=B_{p+1}$).

The maximum value $A_M$ of the real part of Sig must be found.

Figure 2:
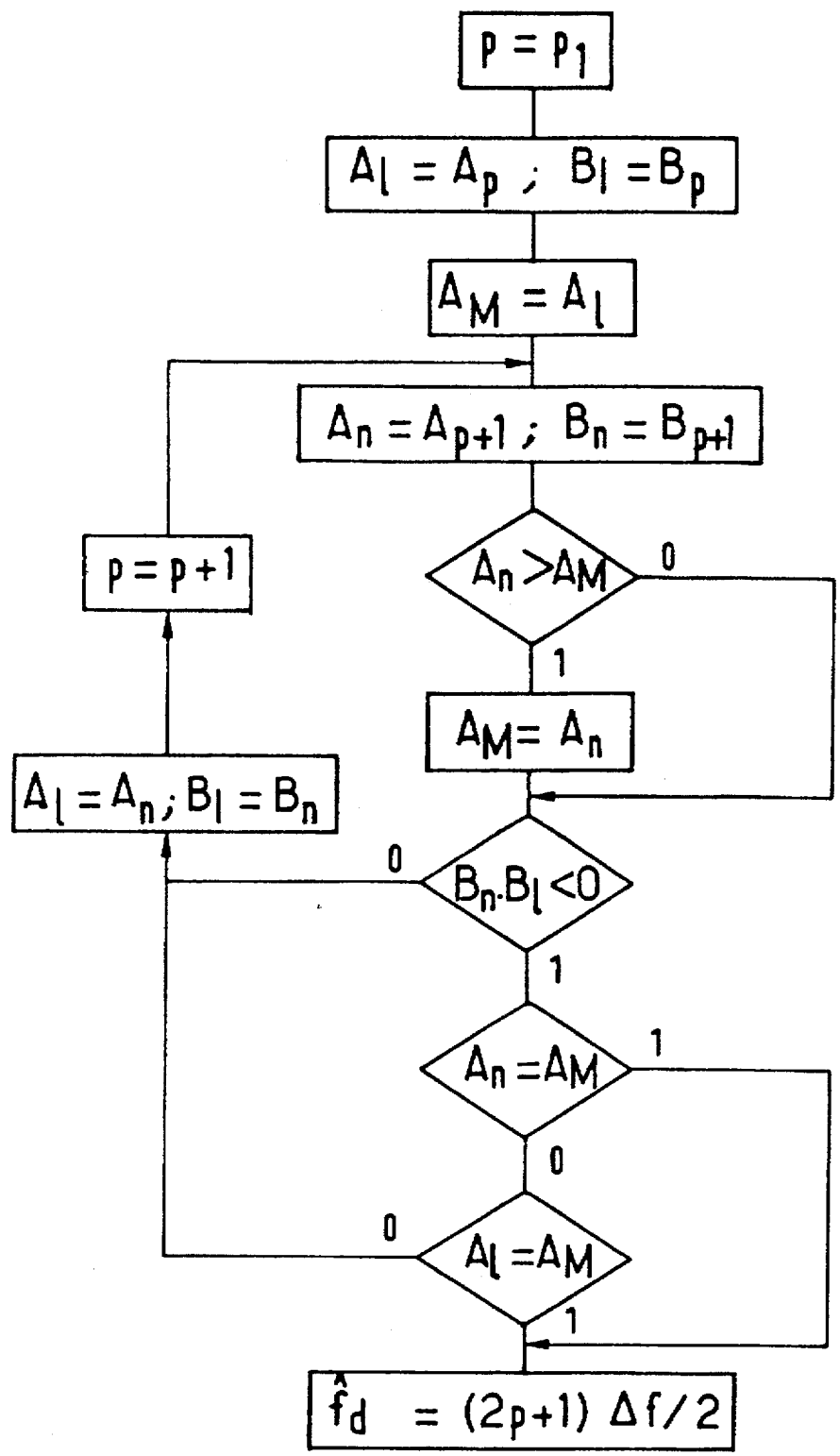
FIG. 2 illustrates one mode of operation of the device.

Referring to FIG. 2, the correction device therefore carries out the following sequence of operations:

a) initialize p to $p_1$;

b) calculate the pair $(A_{p1}, B_{p1})$ corresponding to the first samples received and assign these values to the last pair $(A_l, B_l)$;

c) initialize the maximum $A_M$ to $A_l$;

d) calculate the next pair $(A_{p+1}, B_{p+1})$ and assign these values to the new pair $(A_n, B_n)$;

e) track of the maximum of the real part: if $A_n$ is greater than $A_M$, then assign the value of $A_n$ to $A_M$; if not go to the next operation;

f) find sign reversal of imaginary part: if the product of $B_n$ and $B_l$ is negative, go to the next operation; otherwise go to operation h;

g) search for the maximum of the real part A: if $A_n$ or $A_l$ has the value $A_M$, then the maximum has been found and the value of the frequency offset estimate $\hat{f}_d$ is:

$$\hat{f}_d=(2p+1)\Delta f/2$$

if not, go to the next operation;

h) assign the values of the new pair $(A_n, B_n)$ to the last pair $(A_l, B_l)$, increment p by one unit and repeat from operation d.

It is not necessary to effect all these operations for a pair $(A_p, B_p)$ if the value of $A_p$ is very small.

In this way it is possible to determine a threshold $A_S$ empirically or by simulation below which $A_p$ cannot approach the maximal value.

Figure 3:
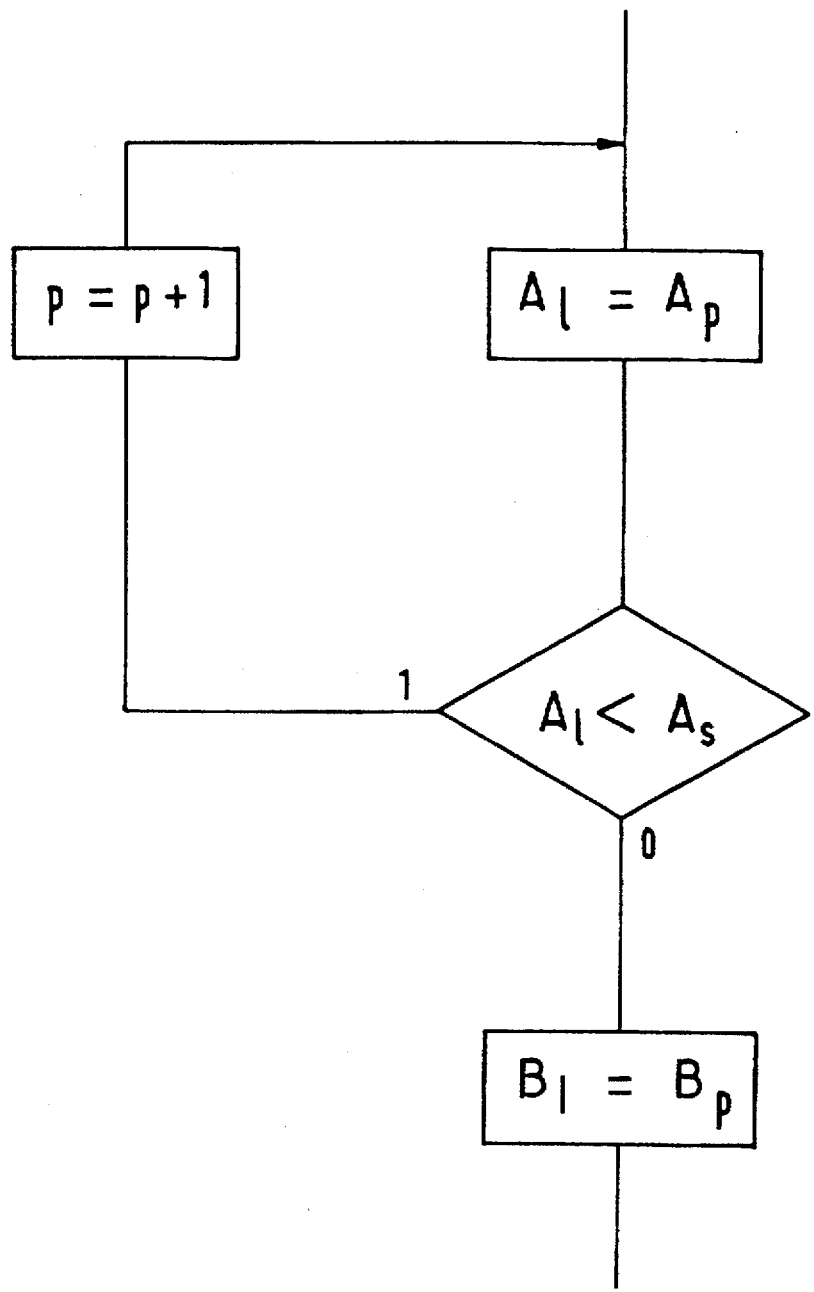
FIG. 3 shows an optional feature of this mode of operation.

Accordingly, the operation b previously described can optionally be replaced by the following sequence of operations before repeating from operation c (see FIG. 3):

b$_1$) calculate the real part $A_p$ and assign this value to the variable $A_l$;

b$_2$) search for threshold violation:
if $A_l$ is less than $A_S$, increment p by one unit and go to operation b$_1$; if not, calculate the imaginary part $B_p$ and assign this value to the variable $B_l$, then go to operation c.

The correction device needs the following data to produce the estimate $\hat{f}_d$ of the frequency offset $f_d$:

a burst of N symbols of the transmit signal $S_E$;

a burst of N pairs of samples corresponding to the transposed signal;

the value of the unit frequency offset $\Delta f$;

the initial value $p_1$ of p.

A first embodiment of the correction device produces the control signal D so that the synthesizer LO produces the conversion signals C1, C2 at a frequency near that of the reference signal. The synthesizer is of the discrete control type and its frequency can therefore be modified (increased or decreased) only by a multiple of an incremental value $V_f$.

The device then produces the estimate $\hat{f}_d$ of the frequency offset $f_d$ as explained above.

Next it looks for the increment a to be applied to the synthesizer for a coarse correction of the frequency offset:

$$\left(q-\frac{1}{2}\right)V_f \leq \hat{f}_d < \left(q+\frac{1}{2}\right)V_f$$

It then commands the synthesizer to shift its frequency by a value equal to the product of the increment a by the incremental value $V_f$.

Two options are then open. The first is to effect the frequency offset correction.

To do this, it is assumed that the offset is constant throughout the duration of the burst of samples, so that the phase shift $\phi$ between two consecutive samples due to this frequency offset is constant and equal to:

$$\phi=2\pi\hat{f}_d.T_S$$

It is therefore necessary to correct the phase of each pair of samples accordingly. It is assumed that the correction to be applied at the middle of the burst of samples is a null correction, which is equivalent, if such were not the case, to merely shifting all the samples by the same value.

For example, if N is odd, the value k of a pair of samples varying from 0 to (N−1), the pair with k=(N−1)/2 will not be corrected. The corrections are symmetrical on either side of the middle of the burst, which means that the phase correction to be applied to pair (N−1−k) is the opposite of that to be applied to pair k.

The correction device therefore calculates a set of adjustment values REG(k) for all values of k from 0 through (N−3)/2:

$$REG(k)=e^{-j[(N-1)/2-k]\phi}$$

Each of these adjustment values REG(k) has a real part U(k) and an imaginary part V(k):

$$REG(k)=U(k)+jV(k)$$

where $$U(k)=\cos[(N-1)/2-k]\phi$$

$$V(k)=-\sin[(N-1)/2-k]\phi$$

The device then produces the corrected samples $I'_R$, $Q'_R$ as follows:

for k<(N−1)/2
$I'_R(kT_S)=I_R(kT_S).U(k)-Q_R(kT_S).V(k)$
$Q'_R(kT_S)=I_R(kT_S).V(k)-Q_R(kT_S).U(k)$ for k=(N−1)/2
$I'_R(kT_S)=I_R(kT_S)$
$Q'_R(kT_S)=Q_R(kT_S)$ for k>(N−1)/2
$I'_R(kT_S)=I_R(kT_S).U(k)+Q_R(kT_S).V(k)$
$Q'_R(kT_S)=-I_R(kT_S).V(k)+Q_R(kT_S).U(k)$ If the second option is adopted, the samples of the transposed signal ($I_R$, $Q_R$) are not corrected and a new burst of samples of the signal is waited for. As the frequency of the frequency synthesizer LO has been corrected already, the frequency offset is already substantially reduced. The correction can therefore be applied to the new burst, using the previous value of the estimate $\hat{f}_d$, i.e. by substituting ($\hat{f}_d$−q.Vf) for the term $\hat{f}_d$ in the phase shift $\phi$, or a new estimate $\hat{f}_d$ of the frequency offset is obtained before the correction is applied on the basis of the new estimate.

Moreover, if the absolute value of $\hat{f}_d$ is greater than the incremental value Vf, the synthesizer LO is corrected accordingly.

The same procedure is naturally adopted for subsequent bursts.

Whichever option is adopted, an estimate is produced of the frequency offset between the receive signal and the frequency implicitly contained in the control signal D, which corresponds to the conversion signals C1, C2 that generated the samples $I_R$, $Q_R$ to which this estimate applies.

For the first estimate, the control signal is initialized by means of the reference signal and is then modified in line with successive estimates.

From the above description it emerges that there are two phases of frequency correction.

In the first phase, which corresponds to the first burst, for example, the frequency offset $f_d$ is not known and can vary widely. On the other hand, it is not necessary to known it with greater accuracy than the adjustment value Vf of the synthesizer LO.

In the second phase, which corresponds to subsequent bursts, the frequency offset is substantially smaller and cannot significantly exceed the adjustment value Vf. On the other hand, it must be known with greater accuracy for the correction to be as effective as possible.

Accordingly, in a second embodiment of the device of the invention, the device first makes a coarse estimate of the frequency offset $f_d$ using a first set of parameters to correct the synthesizer LO and then makes a more refined estimate using a second set of parameters to correct the phase of the samples ($I_R$, $Q_R$) of the transposed signal. The frequency offset is still monitored, in order to adjust the synthesizer LO, if necessary.

This embodiment is explained in the GSM context where signalling bursts and "normal" traffic bursts are used. The signalling bursts include a "frequency burst" made up of 156 known symbols.

This is the burst to be used for the coarse estimate. The value of the unit frequency offset Δf must be determined. Assuming that the incremental value $V_f$ of the synthesizer LO is 5 kHz, this value could be adopted. However, there would be a risk of not detecting the frequency offset. It is therefore preferable to take a lower value, for example 1.5 kHz, for the unit offset Δf. Consequently, if the frequency offset can vary between −45 kHz and +45 kHz, then $P_1$ must be given the value -15 and up to 31 calculations may be needed to arrive at the estimate $\hat{f}_d$ of the frequency offset since p varies from −15 to +15.

This defines a first series of parameters for the coarse estimate which comprises a large number of samples but which has a relatively high unit frequency offset Δf:

N=156 symbols of the transmit signal;
N=156 pairs of samples ($I_R$, $Q_R$) of the transposed signal;
unit frequency offset Δf=1.5 kHz;
initial value of p: $P_1$=−15.

It is of course not necessary to correct the samples.

Following this coarse estimate, the synthesizer LO is corrected, as already mentioned.

The frequency offset is now substantially in the range from −2.5 kHz to +2.5 kHz.

The fine estimate of the frequency offset can be effected on a much smaller number of samples. 24 of the 26 symbols of the training sequence of a "normal burst" are chosen, which has the advantage of not relying on a specific signalling burst.

In this way the known symbols of the burst are used to arrive at the estimate, whereas the correction essentially applies to the data symbols embodying the information conveyed by this burst.

Assuming that the accuracy required for the estimate $\hat{f}_d$ is 150 Hz, the value of the unit frequency offset Δf must be 300 Hz.

On searching for the frequency offset between −2.7 kHz and +2.7 kHz, $P_1$ must be given the value −9 and it may be necessary to effect up to 19 calculations for the frequency offset estimate $\hat{f}_d$ since p varies from −9 to +9.

This defines a second series of parameters for the fine estimate which comprises a small number of samples but which also has a smaller unit frequency offset Δf:

N=24 data symbols;
N=24 pairs of samples ($J_R$, $Q_R$) of the transposed signal;
unit frequency offset Δf=300 Hz;
initial value of p: $p_1$=−9.

Naturally, if $\hat{f}_d$ is less than −2.5 kHz or greater than +2.5 kHz, the correction device operates on the synthesizer LO in such a manner that the frequency offset is brought back into the corresponding range.

It goes without saying that the invention is not limited to the embodiments described in detail. The person skilled in the art will clearly understand that the invention has many other applications.

There is claimed:

1. Device for correcting a frequency offset between a receive signal and a reference signal, said receive signal being fed to a frequency converter which also receives a conversion signal in order to produce a transposed signal, said conversion signal being produced by a local oscillator in response to a control signal, said device comprising:

means for initializing said control signal according to said reference signal;

estimator means which receive said transposed signal and said control signal to produce repetitively an estimate of said frequency offset, said estimate comprising the sum of a correction value and an adjustment value, said correction value being greater than or equal to a predetermined correction threshold and said adjustment value being less than said predetermined correction threshold;

means for modifying said control signal in response to said correction value; and means for correcting said transposed signal by means of at least one of said successive estimates.

2. The device according to claim 1 wherein, said conversion signal comprises discrete frequencies regularly spaced by an incremental value, said correction threshold being equal to said incremental value.

3. The device according to claim 2 wherein said correction value is a multiple of said incremental value.

4. The device according to claim 1, wherein said estimator means effects a first estimate using a first set of parameters dependent on the maximum offset between said reference signal and said receive signal and effects a subsequent estimate using a second set of parameters dependent on said correction threshold.

5. The device according to claim 4 wherein different frequencies of said receive signal are used for said first estimate and for said subsequent estimate.

6. The device according to claim 4 wherein, said receive signal is in the form of a succession of bursts each comprising a training sequence and a data sequence, one of said estimates being effected on said training sequence to correct said data sequence.

7. The device according to claim 1 wherein said estimates are obtained by means of the autocorrelation function of a known sequence of the transmit signal corresponding to said receive signal.

8. Method of correcting a frequency offset between a receive signal and a conversion signal comprising the following steps:

converting said receive signal by means of a conversion signal to produce a transposed signal;

a first estimate of said frequency offset;

modifying said conversion signal when said first estimate exceeds a predetermined correction threshold, said first estimate comprising a sum of a correction value which is a multiple of said predetermined correction threshold and an adjustment value which is less than said predetermined correction threshold, said modifying step including modifying said conversion signal based on said correction value;

producing an estimate of the residual frequency offset between said receive signal and said modified conversion signal; and correcting said transposed signal by means of said residual offset.

9. The device according to claim 1, wherein said transposed signal comprises a plurality of digital samples, said means for correcting said transposed signal calculating corrected digital samples by applying a correction function to each of said digital samples, thereby effecting correction of the transposed signal.

10. The device according to claim 9, wherein said correction function adjusts the relative phase between two consecutive samples.

11. The device according to claim 1, wherein the means for modifying said control signal effects coarse frequency adjustment, and said means for correcting said transposed signal effects fine frequency adjustment.

12. The method according to claim 8, wherein said transposed signal comprises a plurality of digital samples, the correcting step comprising calculating corrected digital samples by applying a correction function to each of said digital samples, thereby effecting correction of the transposed signal.

13. The method according to claim 12, wherein said correction function adjusts the relative phase between two consecutive samples.

14. A device for correcting a frequency offset between a receive signal and a reference signal, said receive signal being fed to a frequency converter which also receives a conversion signal in order to produce a transposed signal, said conversion signal being produced by a local oscillator in response to a control signal, said device comprising:

means for initializing said control signal according to said reference signal;

estimator means which receives said transposed signal and repetitively produces an estimate of said frequency offset;

means for modifying said control signal when said estimate exceeds a predetermined correction threshold, said estimate comprising a sum of a correction value which is a multiple of said predetermined correction threshold and an adjustment value which is less than said predetermined correction threshold, said means for modifying modifying said control signal based on said correction value; and means for correcting said transposed signal produced by said frequency converter by calculating a corrected transposed signal from said transposed signal and from one of said estimate and said adjustment value.

15. The device according to claim 14, wherein said transposed signal comprises a plurality of digital samples, said means for correcting said transposed signal calculating corrected digital samples by applying a correction function to each of said digital samples, thereby effecting correction of the transposed signal.

16. A method of correcting a frequency offset between a receive signal and a conversion signal comprising the steps of:

converting said receive signal by means of a conversion signal to produce a transposed signal;

producing an estimate of said frequency offset;

modifying said conversion signal when said estimate exceeds a predetermined correction threshold, said estimate comprising a sum of a correction value which is a multiple of said predetermined correction threshold and an adjustment value which is less than said predetermined correction threshold, said modifying step including modifying said control signal based on said correction value; and calculating a corrected transposed signal from said transposed signal and from a function of said estimate.

17. The method according to claim 16, wherein said transposed signal comprises a plurality of digital samples, said calculating step comprising calculating corrected digital samples by applying a correction function to each of said digital samples, thereby effecting correction of the transposed signal.

* * * * *